United States Patent
McHenry (10) Patent No.: US 7,409,010 B2
(45) Date of Patent: Aug. 5, 2008

(54) METHOD AND SYSTEM FOR TRANSMITTING SIGNALS WITH REDUCED SPURIOUS EMISSIONS

(75) Inventor: Mark Allen McHenry, McLean, VA (US)

(73) Assignee: Shared Spectrum Company, Vienna, VA (US)

( * ) Notice: Subject to any disclaimer, the term of this patent is extended or adjusted under 35 U.S.C. 154(b) by 0 days.

(21) Appl. No.: 10/861,476

(22) Filed: Jun. 7, 2004

(65) Prior Publication Data

US 2004/0252786 A1 Dec. 16, 2004

Related U.S. Application Data

(60) Provisional application No. 60/477,155, filed on Jun. 10, 2003.

(51) Int. Cl.
*H04L 25/49* (2006.01)
(52) U.S. Cl. ........................ 375/296; 375/297
(58) Field of Classification Search ................ 375/260, 375/295–297, 222, 219, 285; 370/208, 210, 370/206; 455/91; 332/106, 107, 123–127, 332/159–162
See application file for complete search history.

(56) References Cited

U.S. PATENT DOCUMENTS

| | | | | |
|---|---|---|---|---|
| 5,162,937 A | * | 11/1992 | Heidemann et al. | 398/79 |
| 5,177,767 A | * | 1/1993 | Kato | 375/142 |
| 5,748,678 A | * | 5/1998 | Valentine et al. | 375/297 |
| 6,049,707 A | * | 4/2000 | Buer et al. | 455/314 |
| 6,147,553 A | * | 11/2000 | Kolanek | 330/10 |
| 6,154,501 A | * | 11/2000 | Friedman | 375/260 |
| 6,157,811 A | * | 12/2000 | Dent | 455/12.1 |
| 6,240,274 B1 | * | 5/2001 | Izadpanah | 455/39 |
| 6,304,140 B1 | * | 10/2001 | Thron et al. | 330/149 |
| 6,380,879 B2 | * | 4/2002 | Kober et al. | 341/155 |
| 6,529,715 B1 | * | 3/2003 | Kitko et al. | 455/103 |
| 6,570,444 B2 | * | 5/2003 | Wright | 330/149 |
| 6,625,111 B1 | * | 9/2003 | Sudo | 370/203 |
| 6,697,436 B1 | * | 2/2004 | Wright et al. | 375/296 |
| 6,799,020 B1 | * | 9/2004 | Heidmann et al. | 455/103 |

OTHER PUBLICATIONS

"Frequency Domain Equalization for Single-Carrier Broadband Wireless Systems" by David Falconer, et al. *IEEE Communications Magazine*; Apr. 2002.

"RF/Microwave Circuit Design for Wireless Applications" by Ulrich L. Rohde, et al. Published by *Wiley-Interscience*; Mar. 2000.

* cited by examiner

*Primary Examiner*—Tesfaldet Bocure
(74) *Attorney, Agent, or Firm*—Townsend and Townsend and Crew LLP

(57) ABSTRACT

An RF power amplifier architecture minimizes spurious emissions by breaking the transmitted signal into narrow spectrum sub-bands, amplifying each separately, and then combining the signals for transmission purposes.

15 Claims, 8 Drawing Sheets

FIG. 11A
Output power (dBm)=37, IP3 (dBm)=45, gain (dB)=10
Sub Banded Signal Split Between 4 Amps FIG. 11B
Single Amplifier FIG. 11C
Signal Split Between 4 Amps

FIG. 12A

Output power (dBm)=37, IP3 (dBm)=45, gain (dB)=10
Sub Banded Signal Split Between 4 Amps

FIG. 12B

Single Amplifier

FIG. 12C

Signal Split Between 4 Amps

FIG. 13

PRIOR ART

FIG. 14A gain (dB)=10, output power (dBm)=30 n=16384, tstep (nsec)=1, RBW(kHz)=61.0389, fmax (MHz)=499.9695

IP3 (dBm)=40, IP2 (dBm)=50

METHOD AND SYSTEM FOR TRANSMITTING SIGNALS WITH REDUCED SPURIOUS EMISSIONS

This application claims priority under 35 USC 119(3) based on provisional patent application No. 60/477,155 filed on Jun. 10, 2003.

This invention was made with Government support under Contract F30602-03-C-0141 awarded by the Air Force. The Government has certain rights in this invention.

FIELD OF THE INVENTION

The present invention is directed to an RF power amplifier architecture that significantly reduces an amplifier's out-of-band emissions.

BACKGROUND ART

A principle goal of communication systems is to maximize spectrum efficiency via the use of broadband waveforms transmitting over non-contiguous spectrum and to minimize the waveform's adjacent power level. A goal of the Defense Advanced Research Projects Agency (DARPA) in Future Combat Systems (FCS) and other programs is the development of the orthogonal frequency-division modulation (OFDM) for use with tactical systems. The OFDM waveform has perhaps the best combination of multipath and $E_b/N_0$ properties of any waveform. Unfortunately, the OFDM waveform has a high peak to average voltage ratio, which requires very high amplifier linearity to suppress out-of-band emissions. This is a very significant problem that prevents the OFDM waveform in some scenarios because high power, linear amplifiers are not cost effective in many designs. Some designers believe that the OFDM out-of-band emission problem is so severe that single carrier waveforms with special equalization are the preferred solution, see "Frequency Domain Equalization for Single-Carrier Broadband Wireless Systems", David Falconer, et al, IEEE Communications Magazine, April 2002. The proposed technology directly mitigates the OFDM out-of-band emission problem, thus enabling OFDM to be widely applicable in tactical situations.

Minimizing out-of-band and spurious emissions is a very challenging aspect of multi-band radio design. FCC regulations and interference predictions (detailed below) present typical maximum emission values. To achieve low emissions, a combination of high third order intercept amplifiers and tracking filters are required. The filters must be high-Q bandpass filters with the passband set close to the desired output bandwidth. The filters must have high third order intercept points to avoid contributing to the problem they are fixing. These amplifiers and filters are expensive, are large, require high prime power, and are heavy. State-of-the-art broadband, high performance tunable filters are manufactured by PoleZero Corporation. The high $IP_3$ performance (>+50 dBm) PoleZero product is the "Power-Pole" Filter. This device requires approximately 7.5 W of prime power, is several inches in size, and is expensive (~$2 k each). The frequency coverage is only 10 MHz to 700 MHz and each device has a 3:1 tuning ratio.

The required amplifier performance level to obtain low spurious emissions is difficult if not impossible to easily attain in prior art radios. Many radios economize on this part of the design and suffer serious operational limitations or have great difficulties in getting spectrum authorization.

These problems are compounded in the next generation of multi-band radios because the large frequency range and the use of variable transmit bandwidths increases the number of required filters. The goal of transmitting a non-contiguous spectrum requires even greater filter flexibility to accommodate "tailoring" of the transmitted spectrum. It is believed that a "brute-force" amplifier/filtering approach to achieve acceptably low spurious emissions with a multi-band radio, and to achieve reasonable cost, size, weight, and power goals is not possible with current technology.

The maximum permitted spurious transmitted power levels are quite small and require high RF performance to achieve. The maximum power can be determined via two methods. Both methods are used in the current debate on authorizing Ultra-Wide Band (UWB) devices, see the filed comments on Docket 98-153 at www.fcc.gov. This debate is relevant because broadband waveforms create wide bandwidth noise over the approximately the same frequency band that is widely used for terrestrial, tactical communications (20 MHz to 3,000 MHz). Many users within this band have filed comments regarding wideband noise interference applicable to their specific systems, making available detailed, applicable interference analysis.

Figure 13:
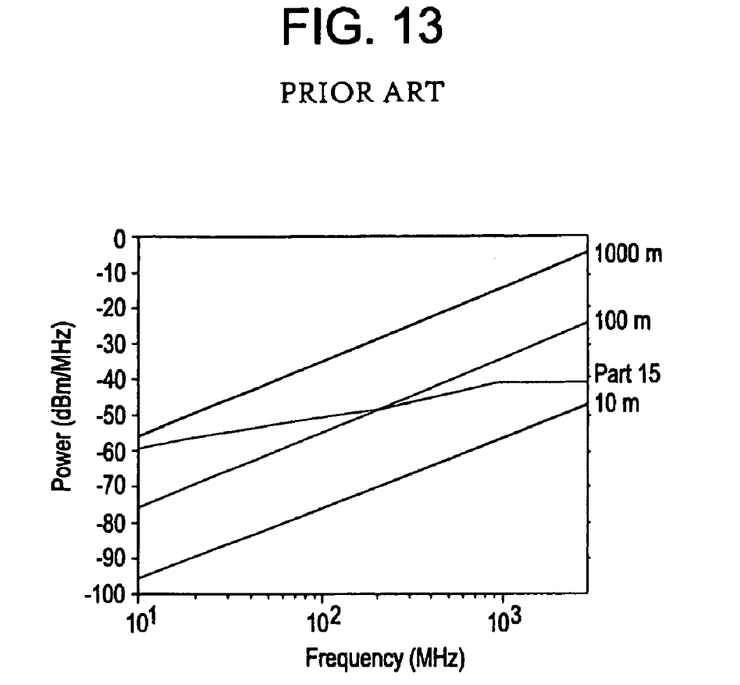
FIG. 13 is a prior art graph showing transmitted power density (dBm/MHz) versus frequency per FCC Part 15 and to equal the noise floor of a 6 dB NF receiver with omni-antennas at different ranges (10 m, 100 m, and 1000 m)

The first method ("Noise Floor Method") to estimate the maximum spurious transmitter power level determines the maximum broadband noise level that can be transmitted that would cause a small (3 dB) rise in the victim receiver's thermal noise floor at a certain distance. Using the free-space range equation, omni-antennas and a 6 dB victim noise figure, FIG. 13 shows the maximum transmitted noise level in dBm/MHz versus frequency for ranges of 10 meters, 100 meters, and 1000 meters. In most cases, frequency sharing using broadband waveforms will occur with distant primary users at 1000 m range or greater. An exception is the GPS band, which will be heavily used in close proximity (a few meters) to tactical receivers.

The second method ("Part 15 Method") to estimate the maximum spurious transmitted power level is to adopt FCC Part 15 (CFR Part 15.209), standards for the amount of unintended power radiated. This standard is a field strength level (100 uV/meter from 30-88 MHz, 150 uV/meter from 88-216 MHz, 200 uV/meter from 216-960 MHz, and 500 uV/meter at greater than 960 MHz) at 3 meters range from the device. FIG. 13 shows this level as "Part 15" transformed back to transmitted power using the free-space range equation and omniantenna gains. Above 960 MHz, the allowed transmission power is −41.2 dBm/MHz.

These two methods provide different power levels, which is partially the key issue in the UWB debate and also creates uncertainty on what levels should be adopted. Several groups have argued that the Part 15 levels are too high for UWB devices and need to be reduced, especially in the GPS bands (1559 MHz-1610 MHz). The FCC has proposed a 12 dB reduction to the Part 15 limit to a value of −53.2 dBm/MHz, FCC Notice of Proposed Rulemaking FCC 00-163. These arguments are related to the high peak to average power ratio of the UWB signal and the large number of expected UWB devices, and may not be applicable to an advanced broadband waveform. The UWB arguments are also focused on interference with nearby (several meters) devices and not with distant (100's of meters) victim receivers. It is believed that the Part 15 requirements are more than adequate for tactical purposes and that the Noise Floor Method is the most applicable. The exception is within the GPS bands wherein the FCC's recommendation of the maximum emission level of −53.2 dBm/MHz appears to be reasonable. Table 1 summarizes the recommended emission levels detailed above.

TABLE 1

Allowable Band Emissions

| Band | Allowable Emission Level in a 1 MHz Bandwidth | Allowable Emission Level in a 61 kHz Bandwidth | Comment |
|---|---|---|---|
| 30 MHz to 100 MHz | −45 dBm/MHz | −57.1 dBm | "Noise Floor Method" |
| 100 MHz to 1,000 MHz | −35 dBm/MHz | −47.1 dBm | "Noise Floor Method" |
| 1,000 MHz to 3,000 MHz[1] | −35 dBm/MHz | −47.1 dBm | "Noise Floor Method" with 20 dB margin to account for directional antennas |
| 1559 MHz-1610 MHz | −53.2 dBm/MHz | −65.3 dBm | GPS band-Follow FCC recommendation |

[1]except for GPS band

What these maximum permitted spurious power levels means is that a non-contiguous waveform must have very low out-of-band emissions to avoid causing interference, and a need exists to have systems that are capable of achieving these low out-of-band emissions.

Figure 14A:
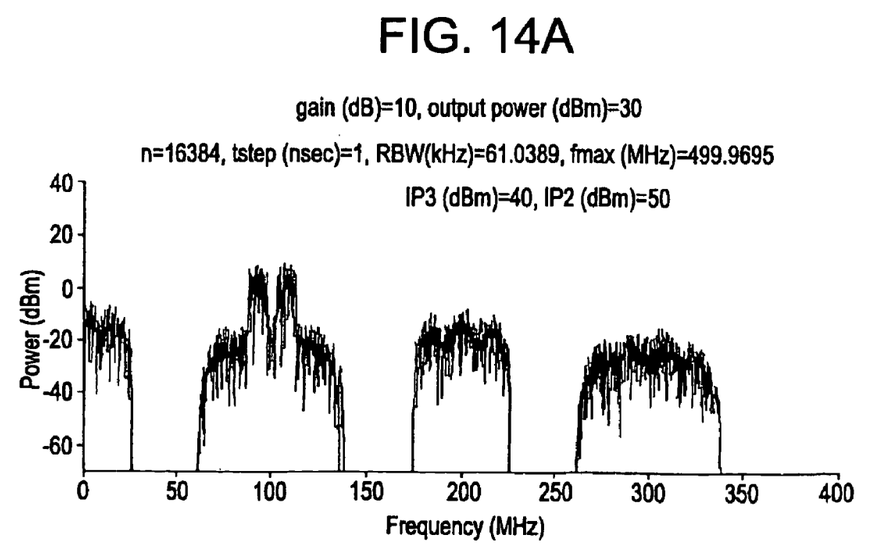
FIGS. 14A-14C are graphs showing output spectrum of a 20 MHz BW broadband waveform (with a 5 MHz gap) at 1 W output with three different amplifiers ($IP_3$=40 dBm top, $IP_3$=50 dBm middle, and $IP_3$=60 dBm bottom), respectively.
Figure 14B:
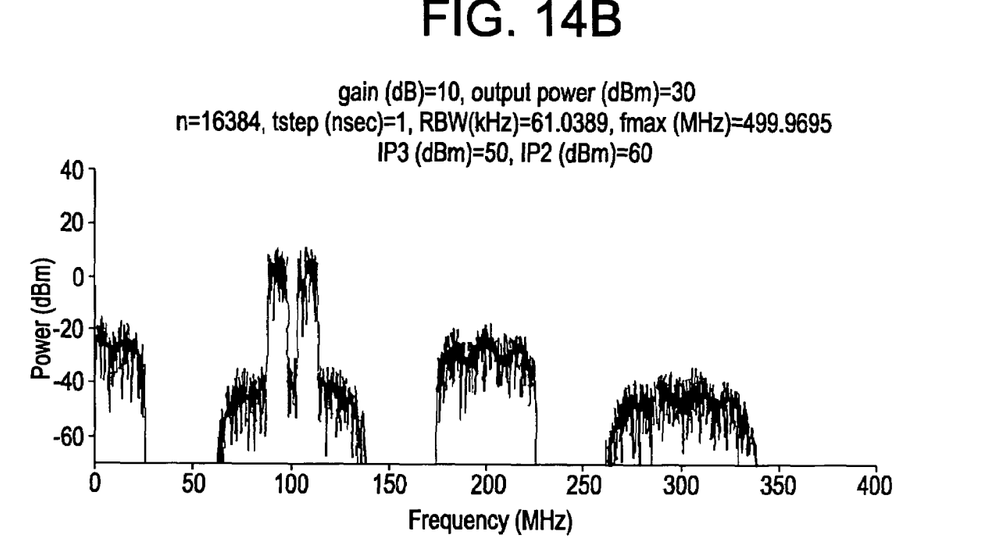
Figure 14C:
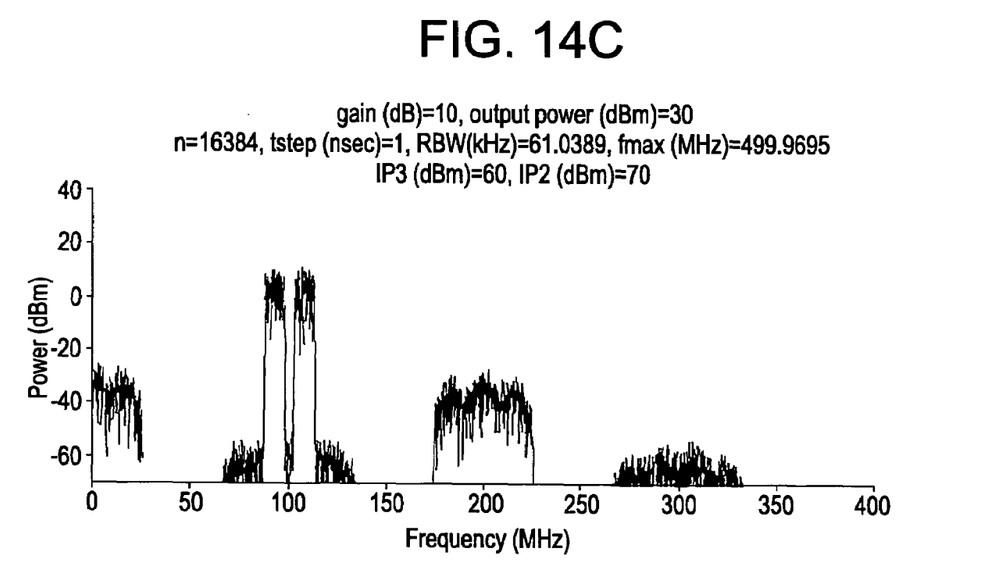

Present day amplifiers are incapable of achieving these low emissions. In this regard, estimates of the out-band emission levels of RF amplifiers with different third order intercept points ($IP_3$) are shown in FIGS. 14A-C. Shown are typical output spectrums with a 20 MHz transmitted waveform with a 5 MHz spectrum gap, 1 W output, and an amplifier $IP_3$ value of +40 dBm (FIG. 14A), +50 dBm (FIG. 14B), and +60 dBm (FIG. 14C). The "noise" level within the spectrum gap (at 100 MHz) is −20 dBm ($IP_3$=+40 dBm) (FIG. 14A), −40 dBm ($IP_3$=+50 dBm) (FIG. 14B), and −60 dBm ($IP_3$=+60 dBm) (FIG. 14C).

Comparing with the allowable emission levels as shown in Table 1 indicates that with this waveform and power level, an output amplifier with $IP_3$~+55 dBm is required. An amplifier with $IP_3$>+60 dBm is required to protect the GPS band, which is not feasible within the SWP constraints of tactical radios. Current multi-band amplifiers have $IP_3$ values of about +42 dBm, Stanford Microdevices SGA-9289 (IP3=42.5 dBm). Thus, burdensome post amplifier bandpass filtering will be required to achieve low spurious output levels with this example waveform, which we believe is similar to what is envisioned for future tactical radios.

Commercially available multi-band RF amplifiers have limited dynamic range performance. It is likely that commercial amplifiers small enough for tactical operations will not have high enough $IP_3$ performance to produce a useful spectrum notch.

Table 2 shows the performance of several types of commercially available RF amplifiers. The performance of the recently introduced WJ Communications AH1 amplifier is shown in the first row. The WJ AH1 is small enough to be useful for small, handheld devices. It's $IP_3$ level of +41 dBm would produce power out-of-band emissions similar to what is shown in FIG. 14A. The Mini-Circuits ZHL-42W is a connectorized instrumentation that covers about the frequency range of interest (30 MHz to 3,000 MHz), but also has a low $IP_3$ value. The Mini-Circuits ZHL-5W-1 has higher output power and IP3 value, but doesn't cover the upper part of the desired frequency range. This is probably due to stray capacitance effects in the baluns and transformers used in the design.

An extreme example is the Spectran MCPA 4080, which is a narrowband PCS base station amplifier. It has excellent RF performance over a narrow (1930 MHz to 1990 MHz) frequency range and would support a low out-of-band emission, non-contiguous waveform. But the required power level of 1130 W is prohibitive, even for vehicle applications. Thus, current amplifiers are still lacking in supporting a low out-of-band emission, non-contiguous waveform.

TABLE 2

Performance comparison of several amplifier types.

| Amplifier | Type | Frequency Range | Output Power | Bias Power | IP3 | Efficiency |
|---|---|---|---|---|---|---|
| WJ Communications AH1 | MMIC component | 250 MHz to 3000 MHz | +21 dBm | 2 W | 41 dBm | 6% |
| Mini-Circuits-ZHL-42W | Connectorized instrumentation amplifier | 10 MHz-4200 MHz | +28 dBm | 12.5 W | 38 dBm | 5% |
| Mini-Circuits ZHL-5W-1 | Connectorized instrumentation amplifier | 1 MHz-500 MHz | +37 dBm | 79 W | 45 dBm | 6% |
| Amplifier Research 5S1G4 | Rack mounted instrumentation amplifier | 800 MHz to 4,200 MHz | +39 dBm | 150 W | 43 dBm | 5% |
| Spectran MCPA 4080 | Rack mounted, single band PCS base station amplifier | 1930 MHz to 1990 MHz | +49 dBm | 1130 W | 81 dBm | 7% |

As such, there is a need for improved amplifiers that reduce an amplifier's spurious emission to maximize spectrum efficiency. The present invention responds to this need by the development of an improved amplifier system that reduces out-of-band emissions, this eliminating significant interference to existing narrow bandwidth users.

SUMMARY OF THE INVENTION

It is a first object of the present invention to provide an improved amplifier system to reduce an amplifier's out-of-band emissions.

The invention entails a new and novel RF power amplifier architecture that significantly reduces an amplifier's out-of-band emissions. This will enable a principle communications goal, to maximize spectrum efficiency via the use of broadband waveforms transmitting over non-contiguous spectrum. The proposed amplifier design reduces out-of-band emissions in the waveform's spectrum holes so they will not cause significant interference to existing narrow bandwidth users operating within the waveform holes. Existing amplifiers will create significant out-band emissions and will severely limit the use of non-contiguous waveforms. The invention also reduces the normal adjacent channel out-of-band emissions.

The proposed sub-band transmitter (SBT) concept minimizes spurious emissions by breaking the transmitted signal into narrow spectrum sub-bands, amplifying each separately, and then combining the signals. This reduces distortion because the spurious spectrum width is dependent on the input spectrum width to each amplifier. By amplifying the spectrum in narrow sub-bands, the spurious energy is not allowed to spread to frequencies away from the desired signal.

The SBT concept's benefit is that it reduces the required amplifier $IP_3$ value (saving prime power) and mitigates the need for highly flexible tracking filters. The only transmit filtering required will be for the removal of harmonic distortion, which can be accomplished with a simple filter design. One embodiment uses four sub-bands to obtain >40 of dB of spurious signal reduction. Of course, other embodiments could use more than four sub-bands, e.g., up to ten sub-bands, which will be practical and will provide exceptional RF performance requiring the use of minimal guard bands.

The inventive sub-band transmitter can easily be implemented. Future transceivers use digital methods and D/A converters at the modem, and can easily divide the signal into spectral sub-bands. Having parallel up-converter chains is easily accommodated because the local oscillator can be shared between the channels and the remaining "parallelized" parts are low cost and low power.

Other objects and advantages of the present invention will become apparent as a description thereof proceeds.

In satisfaction of the foregoing objects and advantages, the present invention provides improvements in methods and systems involving transmission of signal by vastly reducing spurious emissions. In one method aspect, the invention is an improvement in the method of transmitting a signal based on a received analog input signal wherein the input signal is amplified for transmission via an antenna. According to the invention, the input signal is subdivided into a plurality of sub-bands, with each subdivided signal up-converted, amplified, and then combined for transmission via the antenna.

The invention also entails calibrating each sub-band's relative amplitude and phase values so that the combined signals approximate the input signal to be transmitted. One calibration method involves making an initial relative amplitude and phase measurement, and then making subsequent amplitude only measurements using a swept CW signal for each sub-band to determine amplitude and phase corrections for each sub-band.

An alternate calibration method involves generating a pair of CW signals and iteratively varying the relative amplitude and phases of the pair of CW signals until a summed output is minimized to determine the relative amplitude and phase values for the subdividing step.

A third alternative involves generating a test signal, amplifying the test signal and looping back the amplified signal to a receiver and modulator for measuring of the amplitude and phase of the looped back signal relative to the amplitude and phase of a signal corresponding to the analog input. A variation of the third alternative involves providing a test signal, amplifying the test signal and transmitting the amplified test signal using a first transceiver to a second transceiver. Then, the relative amplitude and phase values of the transmitted test signal is determined by digitizing the test signal, transforming the digitized signal into sub-bands, and amplifying the sub-bands. The second transceiver transmits the determined relative amplitude and phase values back to the first transceiver to set the amplitude and phase of the sub-bands for the subdividing step. The first receiver can include a loop back switch to allow transmission of the test signal to the second transceiver and receipt of the determined relative amplitude and phase. The second transceiver can include a loop back switch to receive the transmitted test signal, and to permit transmission of the determined relative amplitude and phase of the sub-bands to the first transceiver. The test signal can comprise a number of test signals, each test signal transmitted over the same frequency range using different spreading codes.

The invention also provides a system architecture that is improved over systems wherein an analog input signal is transmitted via an antenna using an up-converter and an amplifier. According to the invention, a processing module is provided that converts the received analog input signal into a digital signal, parses the digitized signal into a plurality of sub-bands, calibrates the sub-bands, and converts each sub-band into an analog signal. An up-converter and amplifier is provided for each sub-band. A combiner combines each of the amplified sub bands for transmission. Means can be provided for calibrating out amplitude and phase differences in each digitized sub-band. The calibrating means can include means for generating a test signal corresponding to each sub-band and measuring the output signal for each sub-band to determine amplitude only or amplitude and phase corrections.

In an alternate mode, the system calibrates using means for generating a pair of test signals and varying the amplitude and phase of the test signals, and means for detecting the zero output signal of the combiner to determine the amplitude and phase values for the digitized sub-bands.

In yet another alternate mode, the calibrating means further comprises means for generating a test signal for output by one of the amplifiers, and a loop back switch downstream of the one amplifier, a transceiver receiving output from the loop back switch; output of the transceiver being sent to the processing module, the processing module measuring the amplitude and phase of the output from the transceiver relative to the test signal input to determine amplitude and phase corrections. A further variation of this mode, first and second transmitter systems are provided. The output of the loop back switch of the first transmitter system is transmitted to the transceiver of the second transmitter system, the second transmitter system transforming the test signal into sub-bands and numerically determining the relative amplitude and phases of the sub-bands, and then transmitting the numerically determined relative amplitude and phases to the first transmitter system for setting of the amplitude and phase values.

The invention also entails a universal processing module for transmitting an analog input signal that comprises an analog to digital converter for digitizing the analog input signal and means for subdividing the digitized signal into a plurality of sub-bands and calibrating the sub-bands to account for amplitude and phase differences. A digital to analog converter is provided for each sub-band, the output of each digital to analog converter adapted for later up-converting, amplification, and combining into one signal for transmission purposes. A detector is also provided that is adapted to receive a sample of the combined output signal of the amplified sub-bands, and to send the sample to the subdividing means as part of calibrating the sub-bands. The subdividing means further comprises a microprocessor adapted to receive the output from the detector for calibration purposes.

BRIEF DESCRIPTION OF THE DRAWINGS

Reference is now made to the drawings of the invention wherein.

DESCRIPTION OF THE PREFERRED EMBODIMENTS

Figure 1:
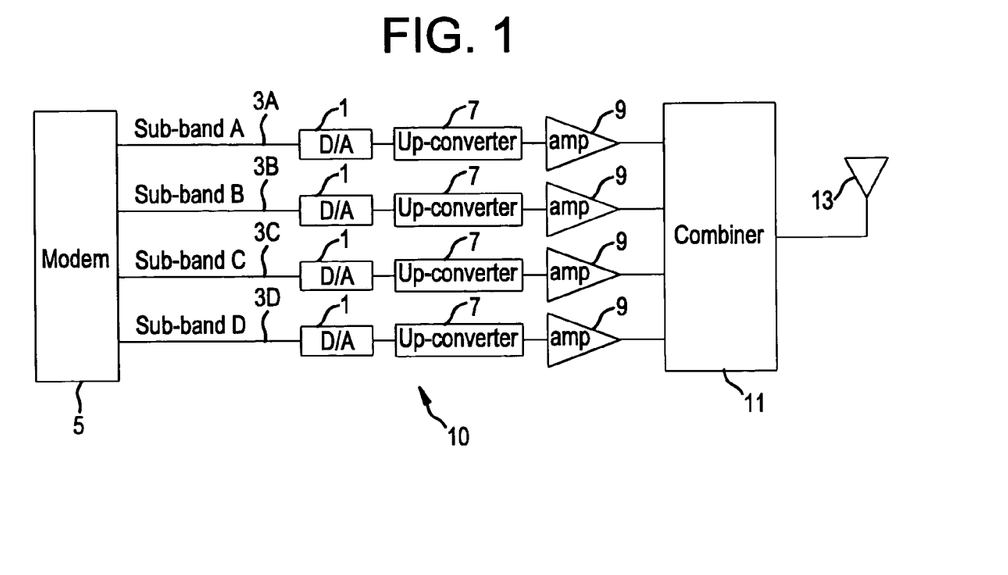
FIG. 1 is a schematic of one embodiment of a sub-band transmitter (SBT) system that reduces the out-of-band emissions by using multiple amplifier chains to transmit spectrum sub-bands.

The inventive sub-band transmitter system greatly reduces spurious emissions by amplifying narrow spectrum sub-band "slices" and then combining them to obtain the full spectrum. FIG. 1 shows an exemplary system architecture 10 that uses multiple digital to analog (D/A) converters 1 that receive different waveforms or 'sub-bands' 3A-3D that are produced by a modem 5. In this embodiment, the sub-band waveform's bandwidth is approximately one quarter the final signal bandwidth, but the bandwidth may vary depending on the number of sub-bands. The sub-band signals 3A-3D are converted to analog using the D/A converters 1, up converted at 7, amplified at 9 using four amplifiers, and then combined using combiner 11 before being sent to the antenna 13.

Figure 2:
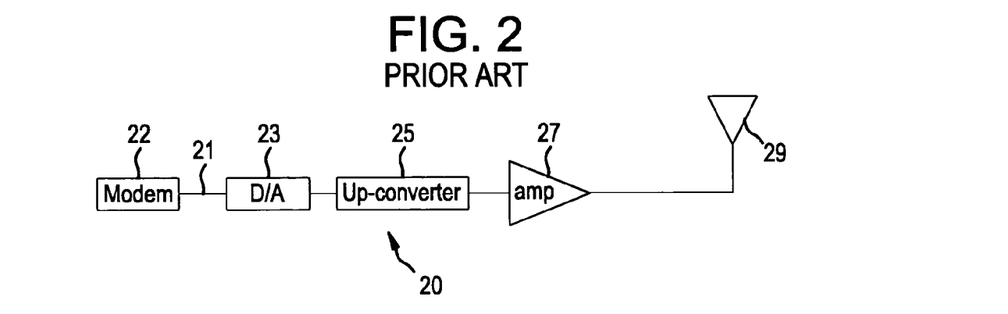
FIG. 2 is a schematic of a prior art transmit amplifier system with a single signal path that amplifies the entire signal spectrum.

For comparison, FIG. 2 shows a conventional architecture with a single transmitter chain 20, using a single path that converts the signal 21 from the modem 22 to analog at 23, up-converts at 25, amplifies at 27, and then sends the signal to the antenna 29.

In the sub band method, amplitude and phase differences between the transmitter channels are minimized during the system's manufacture, and drifts with time or temperature are calibrated out. The calibration technique (described later) utilizes a built in test system with a loop back circuit to the associated receiver, or via feedback from other receivers. The calibration is further simplified if the modem is flexible enough to put the entire signal through one channel or send continuous wave (CW) calibration signals on each channel for diagnostic or calibration purposes (also described later).

Figure 3:
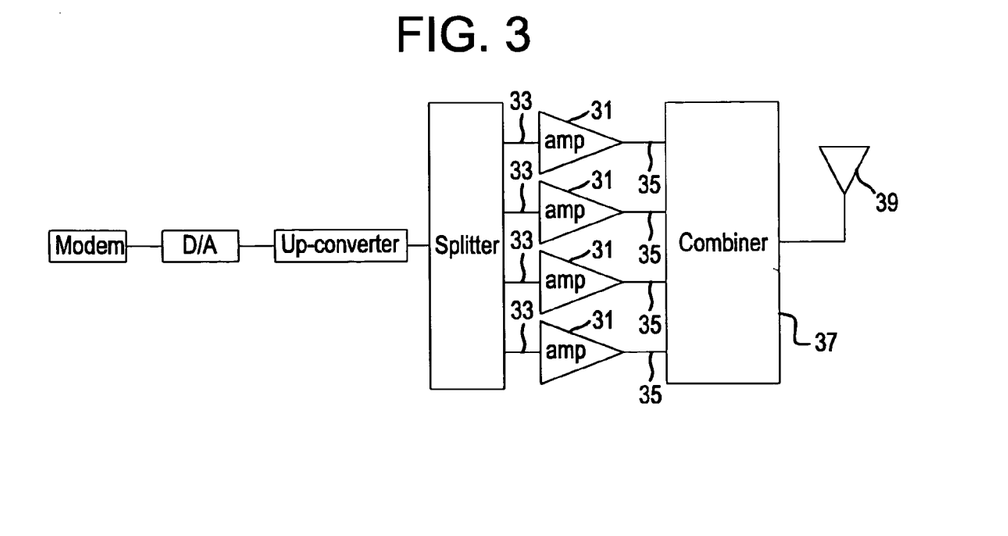
FIG. 3 is a schematic of an alternate transmitter system that uses multiple amplifiers.

An alternate configuration 30 shown in FIG. 3 (that will be analyzed in the next section) has parallel amplifiers 31 that operate on the entire signal spectrum 33, with the amplifier outputs 35 combined at 37 and directed to the antenna 39. The parallel amplifiers provide a higher degree of linearity or net higher third order intercept point, but as will be shown in comparison to the invention below, provide marginal reduction in spurious emissions.

A key sub-band transmitter issue is calibration of each sub-band signal path's relative amplitude and phase so that the combined signal approximates the desired signal. The specific relative amplitude and phase requirements will vary for different waveform types, but are likely to be a several tenths of a dB in amplitude and a few degrees in phase. These will probably not be met with RF hardware manufacturing tolerances and will probably require periodic recalibration to account for temperature effects, different output frequencies, or output power levels. The calibration may also need to be updated if there are changes in the output impedance due to changes in the antenna or the feed line.

The present invention has three alternate schemes of calibrations. The first is to directly measure the transfer characteristics of each channel using a swept CW signal. In this mode, the signal does not require demodulation. The second mode is a cancellation technique where the relative amplitude and phase of pairs of signals are iteratively varied until the summed output is minimized, thus determining the relative amplitude and phase values. The third mode involves using waveforms with different spreading codes on each channel, demodulating the signals, and using signal processing to determine the relative amplitude and phase.

The calibration method selection depends on the characteristics of the hardware's amplitude and phase differences between the sub-bands and the level of integration between the SBT amplifier and the receiver.

Figure 4A:
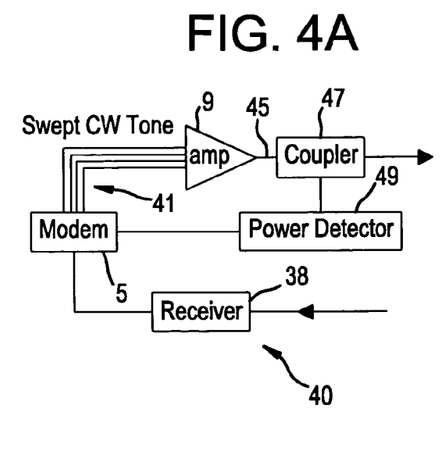
FIGS. 4A and 4B are schematics showing calibration methods using amplification only amplifier only and amplification/phase control, respectively.
Figure 4B:
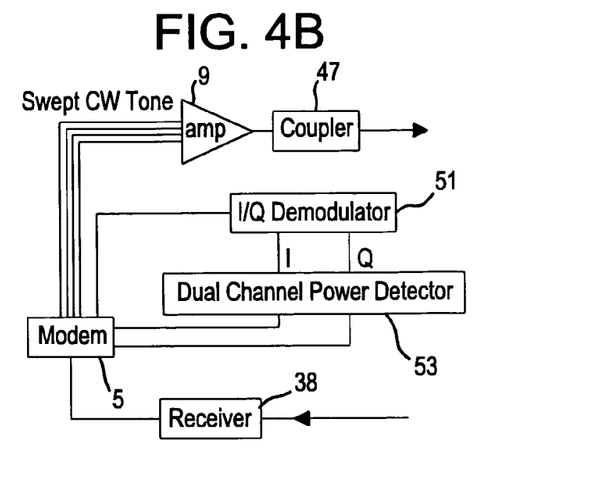

The first and simplest method involves initially measuring the relative amplitude and phase of each sub-band using external equipment during manufacture and then an amplitude only calibration for in-field adjustments. The amplitude only system is shown in FIG. 4A as reference numeral 40. The system 40 would use swept CW signals 41 generated by the modem 5 on each sub-band one at a time and then measure the output power level 45 from amplifier 9 using a coupler 47 and power detector 49. The detector would be very simple and would not use any filtering or RF frequency conversion. This method presumes that an amplitude only measurement would be sufficient to determine both amplitude and phase corrections. If the amplitude only measurement is insufficient to determine both amplitude and phase correction, then an I/Q demodulator 51 with a dual power detector 53 could be used to measure amplitude and phase as shown in FIG. 4B.

The principle advantage of this technique is that it is independent of the receiver 38 and would accommodate a low cost, fully integrated amplifier design.

Figure 5:
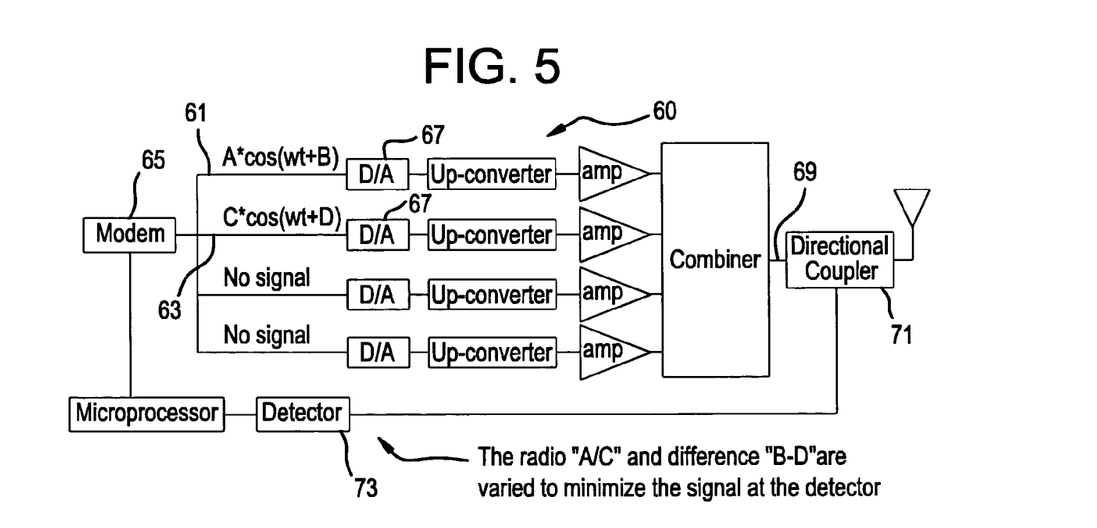
FIG. 5 is a schematic showing how the relative amplitude and phase between any two channels can be found by canceling the output signal.

The second calibration mode uses cancellation to determine the relative amplitude and phase between channels. Referring now to FIG. 5, the system represented by 60 sends CW signals 61, 63 from modem 5 through two channels. Using the D/A converter 67, the amplitude and phase of the signals can be precisely controlled digitally. The combiner's output signal level 69 is measured using a directional coupler 71 and a detector 73. When the relative amplitude of the input signals is equal and the phase is 180° apart, the signal amplitude leaving the coupler will be nearly zero. The energy will be absorbed in the combiner. Using an iterative search technique, the "cancellation" amplitude and phase values can be found very rapidly (10's of trials within milliseconds).

The desired operational amplitude and phase values for normal transmission have the two signals equal in amplitude and in phase. Thus, the operational amplitude and phase values are the cancellation values with an additional 180° phase change. This processes is repeated with the other channels while keeping one channel as a reference.

The advantage of this method is that is independent of the receiver 38 and would accommodate a low cost, fully integrated amplifier design. The disadvantage of this method is that the combiner must be able to dissipate large power levels. However, it is believed that the iterative technique will occur so rapidly that little energy will be adsorbed by the combiner and that that the combiner only need to be able to withstand a high transient voltage (10 W peak power would create about 31 volts) and not sustained high power levels.

Figure 6:
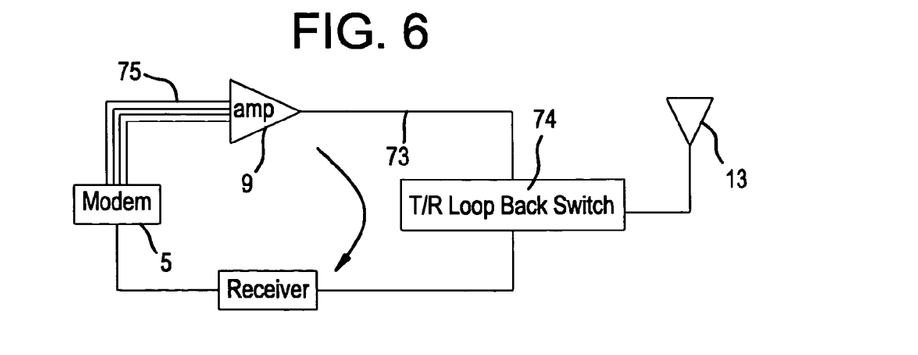
FIG. 6 is a schematic showing a loop back calibration method.

Referring now to FIG. 6, the third calibration mode is to loop back the signal 73 from the amplifier 9 to the receiver 38 using the loop back switch 74 and let the modem measure the amplifier's output signal amplitude and phase relative to the signal input to the amplifier. This is illustrated in FIG. 6. The test signal 75 could be a swept CW signal, a special test waveform, or the operational data waveform. The additional RF hardware needed for calibration is an RF switch and an attenuator and compared to the previous methods, this approach may have a lower hardware cost. Additionally, the transceiver needs to be able to operate in a duplex mode (able to simultaneously transmit and receive). However, in many cases the transceiver is not a duplex design and this calibration approach would not be applicable.

Figure 7:
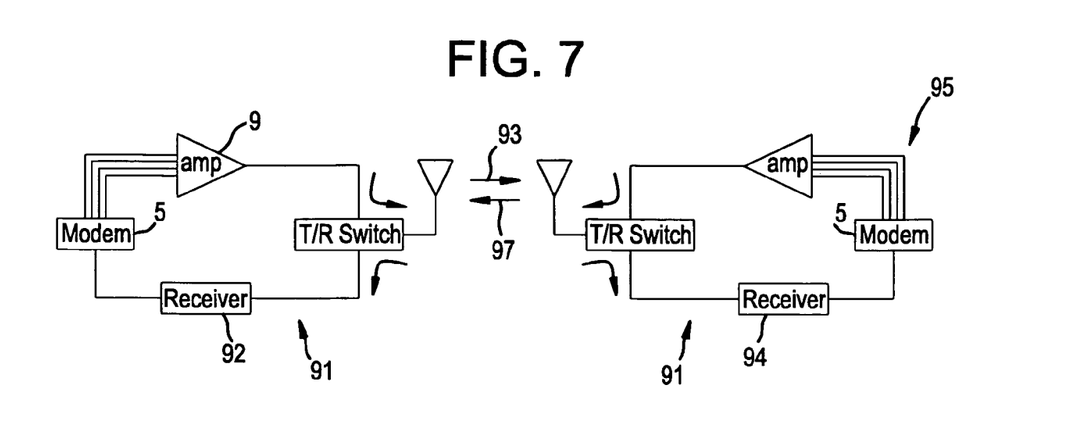
FIG. 7 is a schematic showing a communications link loop back calibration method.

A variation of the third calibration method is to have pairs of nodes 91 calibrate themselves using a communications link loop method as shown in FIG. 7. In this method, the first transceiver 92 transmits a known wideband test signal and the second transceiver 94 digitizes the waveform, transforms the signal into sub-bands 95, and determines the relative amplitude and phase numerically. The second transmitter 94 then sends this calibration information 97 to the first transceiver to use to set the amplitude and phase of the sub-bands. A similar technique has been proposed by other researchers to pre-equalize signals to compensate for multipath effects.

To initiate the process when there is no information on the relative sub-band amplitude and phases, a single sub-band could be used for low rate communications between the transceivers until the relative amplitudes and phases are measured.

The communications link loop back approach potentially is the lowest cost calibration method because it requires no additional RF hardware for calibration.

Figure 8A:
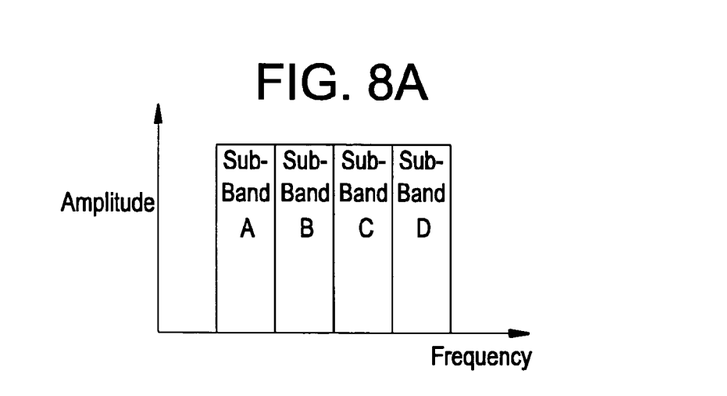
FIGS. 8A and 8B show a waveform in normal operation with each channel transmitting in different sub-bands, and a calibration waveform with each channel transmitting on the same sub-band simultaneously, respectively.
Figure 8B:
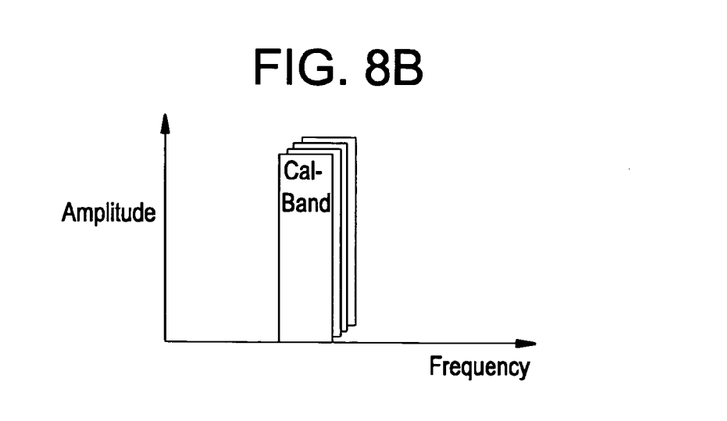

An extension of the third calibration technique is to have the modem transmit calibration signals with different waveforms on the same sub-band channel. FIG. 8B shows each sub-band channel transmitting using the same frequency band but using a waveform with different direct sequence spreading codes. The receiver 92 or 94 demodulates the four waveforms, and determines the relative amplitude and phases between each channel. By changing the center frequency of the calibration waveform, the relative amplitude and phase of the channels at any desired frequency can be obtained. FIG. 8A shows the waveform in normal operation with each channel transmitting in different sub-bands.

This extension of the third method calibration of the third method is to integrate the calibration procedure with the equalizer used by the receiver 94 to compensate for multipath. Multipath generates similar amplitude and phase variations with frequency as the differences between the RF chains in the sub-band architecture. The receiver 94 automatically corrects for the multipath amplitude/phase variations and would also correct for the RF chain amplitude/phase variations.

Figure 9:
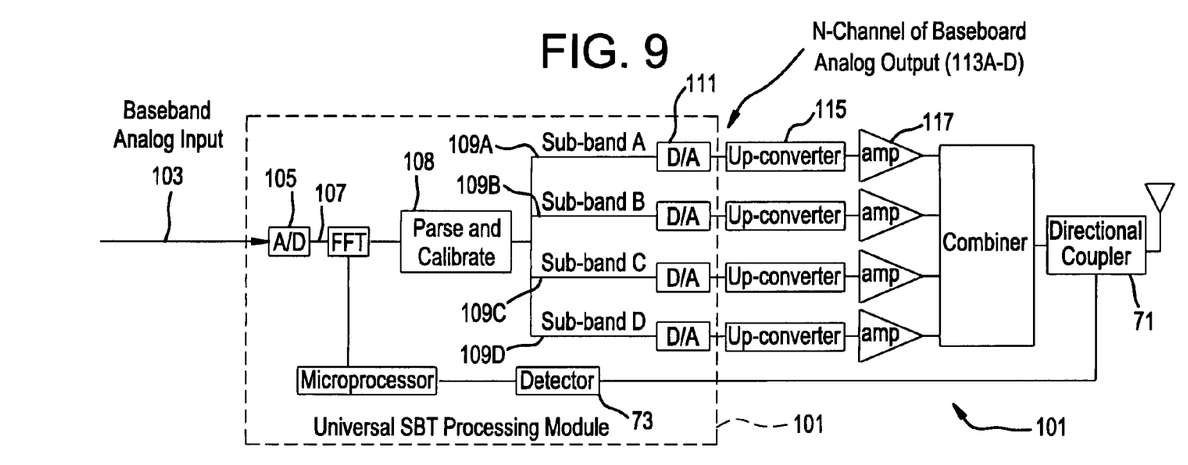
FIG. 9 is a schematic showing a universal sub-band transmitter processing mode architecture.

To maximize the application of the sub-band transmitter technology to a wide range of applications, including defense-related applications, an architecture is desired that is independent of the output frequency, the waveform type, the modem design, and the frequency up conversion process. In the embodiment of FIG. 1, the modem 5 splits the signal into sub-bands digitally. This requires that the SBT transmitter be integrated into the modem or use digital waveform data as an input signal. It would be desirable to provide architecture that would be independent of this requirement. An architecture meeting these goals is shown in FIG. 9 and designated by the reference numeral 100. A universal sub-band transmitter processing module is designated as 101. This module enables the sub-band transmitter concept to be generally applied. The input signal to the module 101 is an analog IF signal 103 that is digitized by analog-to-digital converter 105. The digitized signal 107, is split or parsed into sub-bands 109A-109D at 108, calibrated, and is converted back to analog by converters 111. Four (or more) of these analog signals 113A-113D are the universal module output. Each of these signals is frequency up converted at 115 and amplified at 117 by RF components that are appropriate for the specific transmitter design.

The universal module 101 uses the cancellation calibration method shown in FIG. 5 and only requires a coupled sample of the output signal. This approach is independent of the output frequency (RF detectors are very broadband), is independent of the waveform type as long as the A/D and D/A dynamic range are high enough, has no connection to the modem, or the frequency up conversion. The calibration process could be triggered by a single control line or could be regularly spaced in time without coordination (the amount of "down time" would be negligible).

The universal module 101 is comprised of an A/D converter 105, FFT functions 107, parse and calibration 108, and D/A components 111. The largest cost would be for the FPGA or ASIC used for the FFT and other digital operations. Depending on the waveform type, the module's hardware cost would be approximately the same as the modem cost because they have similar processing loads.

The universal module 101 would be applicable to nearly any wide bandwidth radio needing high transmit power (>5 W). There would also be a significant commercial market for cellular base stations and other high power applications.

Figure 10:
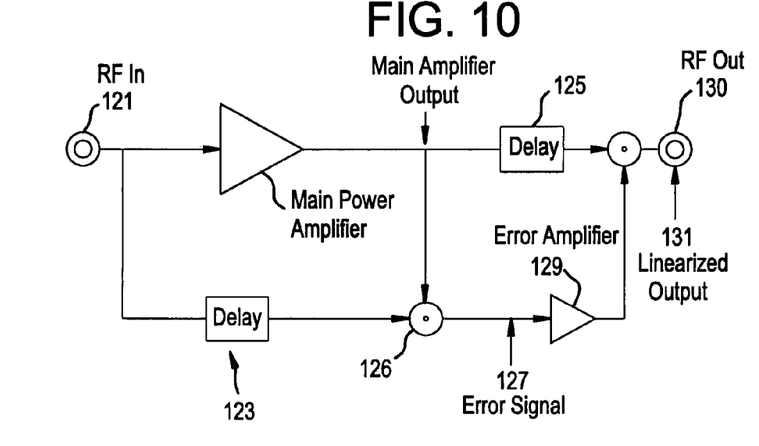
FIG. 10 is a schematic showing current amplifier technology using a feed-forward method to subtract non-linear signal components.

The inventive sub-band transmitter is novel compared to the technical approach used in present high power, low distortion amplifiers. Practically all multi-carrier power amplifier designs are based on the feed-forward architecture. This architecture, as shown in FIG. 10, consists of two control loops: a signal cancellation loop and an error cancellation loop. In a feed-forward amplifier, the clean input signal 121 is first delayed at 123 and matched in amplitude and phase to the output signal 125 of the main power amplifier, and then subtracted from it at 126. The result is an error signal 127, which contains the inter-modulation products of the main amplifier and only small residues of the signal itself. This error signal is again amplified at 129 and matched in delay, amplitude and phase to the output of the main amplifier 125, and then subtracted from it at 130 to create a clean output signal 131.

Feed-forward is a well-established, solid architecture. It has important advantages such as high performance across large bandwidths as well as unconditional stability. It also has serious drawbacks, which have historically limited the economy and performance of the power amplifier. The most serious limitation of the feed-forward architecture is its requirement for an extremely accurate RF design. This is needed because of the two signal subtractions performed; one in the signal cancellation loop at 126 and one in the error cancellation loop at 130. The accuracy of these subtractions requires that the two signals be matched in delay to fractions of a nanosecond, in amplitude to tenths of a dB, and in phase to tenths of a degree. Typically, this accuracy must be maintained over 25 MHz of bandwidth, across the entire temperature range of the equipment, for a range of DC voltages, and for a large dynamic range of the amplified signal. Providing all this in a very reliable, low cost, mass-produced, high power unit proved to be an extremely difficult technological challenge.

The inventive sub-band transmitter concept reduces unintended emissions by an entirely different method than the feed-forward method. The inventive sub-band transmitter limits the frequency range of the, distortion signals by limiting the frequency range that each active device must amplify.

It should be noted that the both the inventive sub-band transmitter and the feed-forward techniques can be used together to further improve the amplifier's performance.

The sub-band transmitter of the invention is provides vast improvements over the prior art by significantly reducing a power amplifier's undesired out-of-band emissions. A detailed time-domain simulation was performed using Matlab that estimated the spurious emission levels of each of the three amplifier architectures described in the previous section. A well-known Taylor series expansion amplifier model was used. This model simulates the non-linear effects of a RF amplifier and the model was used in the analysis presented in several of the figures discussed below.

The amplifier was modeled using a traditional Taylor Series expansion, see Wireless Circuit Design, pg 91, Rohde and Newkirk, 2000. The expansion coefficients (k1, k2, and k3) are related to $IP_3$ and $IP_2$ as shown below. The $IP_2$ value was 10 dB larger than the $IP_3$ value. The $IP_3$ was parametrically varied.

The "Taylor Series" amplifier model is $$y = k1*x + k2*x.*x + 3*x.*x.*x;$$

where x=input voltage;
y=output voltage;
k1=sqrt(10^(gain_dB/10));           linear coefficient
k2=-2*k1^2/IP2_V;                   second order coefficient
k3=-4*k1^3/(3*IP3_V^2);             third order coefficient
IP3_W=.001*10^(output_IP3_dBm/10);
IP3_V=sqrt(2*IP3_W*R);              Convert power to voltage
IP2_W=.001*10^(output_IP2_dBm/10);
IP2_V=sqrt(2*IP2_W*R);
R=50 ohms.

Using the model described above, the input signal was a 27 dBm-power level, broadband signal with 1024 equally spaced tones spaced over a 20 MHz bandwidth centered at 100 MHz.

Figure 11A:
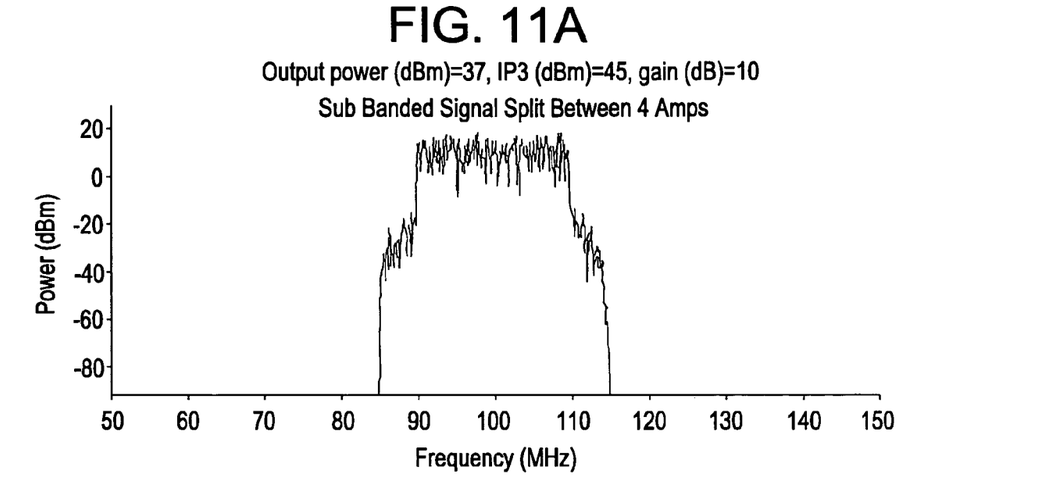
FIGS. 11A-11C shows a first graph of the sub-band transmitter output spectrum and four amplifiers, a second graph of the output spectrum with a single amplifier transmitting the entire spectrum (baseline), and a third graph showing the output spectrum with four amplifiers in parallel each transmitting the entire spectrum (baseline with equivalent amplifiers), respectively.
Figure 11B:
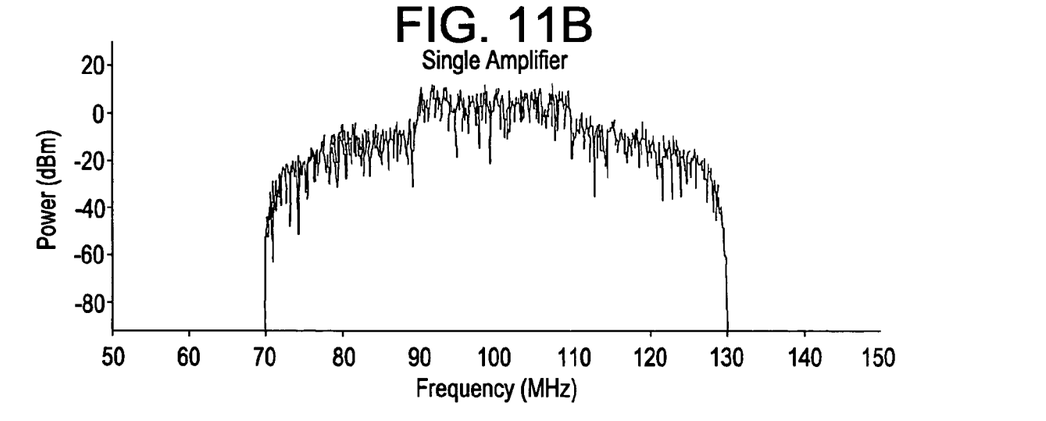
Figure 11C:
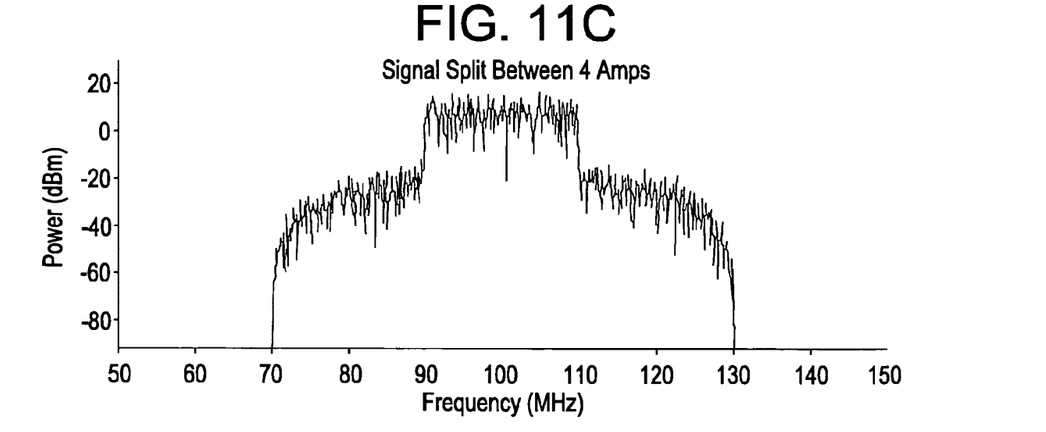

FIGS. 11A-C shows the transmitted spectrum with each amplifier architectures described previously. FIG. 11A shows the output spectrum using the system of FIG. 1 wherein each sub-band is amplified. FIG. 11B shows the output spectrum using the prior art system of FIG. 2 wherein the entire spectrum is amplified and transmitted (the baseline). FIG. 11C shows the system of FIG. 3 wherein four amplifiers operate in parallel on the entire spectrum (baseline with equivalent amplifiers). The spectrum was created using an FFT of the voltage time series with a resolution bandwidth of 61 kHz.

The sub-band transmitter of FIG. 1 produces an output spectrum in FIG. 11A with spurious emissions that are greatly reduced (more than 40 dB at most frequencies) compared to the other architectures as shown in FIGS. 11B and 11C. In contrast, there is a large "pedestal" of spurious emissions surrounding the desired signal in the baseline (FIG. 11B) and alternate four-channel (FIG. 11C) configurations. The spurious signals are due to cross modulation and typically extend in frequency on both sides of the desired signal by the signal bandwidth amount. Extensive filtering would be required to reduce these levels to the required −47.1 dBm to −57.1 dBm (in a 61 kHz resolution bandwidth that is currently mandated as discussed above, see Table 1). By sub-banding, the spectrum "shoulder width" is greatly reduced and no filtering is required (other than to remove the harmonic distortion at 200 MHz). It is believed that by increasing the number of sub-bands from four to eight, that the remaining "shoulder" spurious emissions shown in FIG. 11A would be further reduced and effectively eliminated.

Figure 12A:
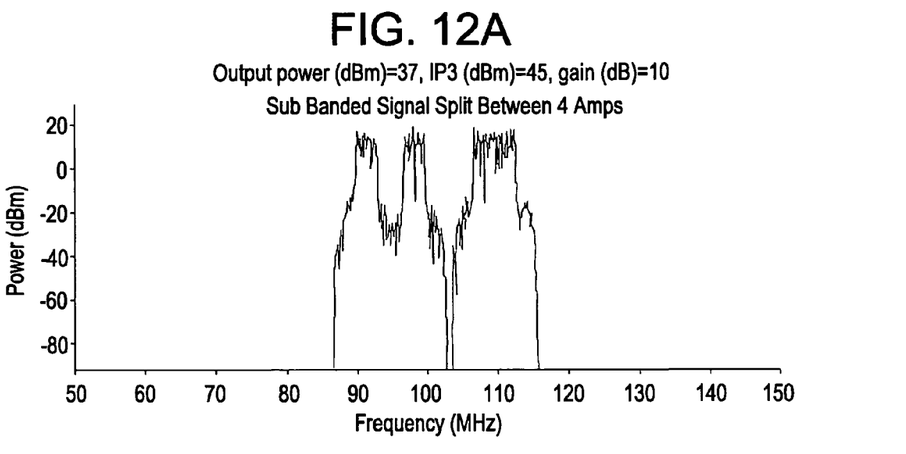
FIGS. 12A-12C deal with a non-contiguous spectrum and show a first graph of the sub-band transmitter output spectrum and four amplifiers, a second graph of the output spectrum with a single amplifier transmitting the entire spectrum (baseline), and a third graph showing the output spectrum with four amplifiers in parallel each transmitting the entire spectrum (baseline with equivalent amplifiers), respectively.
Figure 12B:
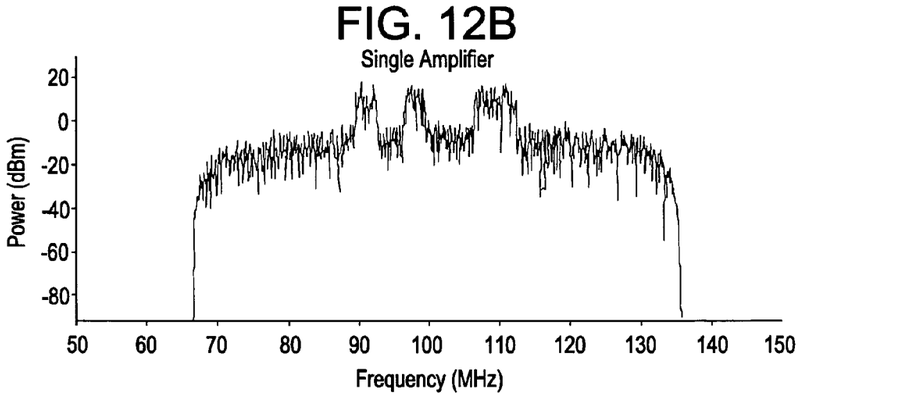
Figure 12C:
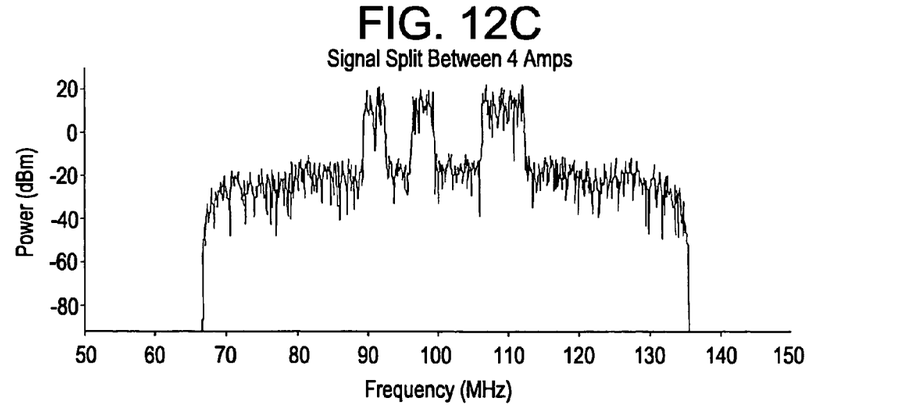

FIGS. 12A-C show a similar simulation except that a discontinuous spectrum is used. Again, the sub-band transmitter of the invention provides very small spurious emissions and even provides a significant reduction in the spectrum level in the spectrum gap, see FIG. 12A. If the emission levels in the gap need further reduction, a tunable notch could be used. This is much simpler than not employing the inventive technology and using a combined tunable bandpass (with variable pass band size) and a tunable notch.

As such, an invention has been disclosed in terms of preferred embodiments thereof which fulfills each and every one of the objects of the present invention as set forth above and provides new and improved RF power amplifier architecture.

Of course, various changes, modifications and alterations from the teachings of the present invention may be contemplated by those skilled in the art without departing from the intended spirit and scope thereof. It is intended that the present invention only be limited by the terms of the appended claims.

What is claimed is:

1. In a method of transmitting a signal based on a received analog input signal wherein the input signal is amplified for transmission via an antenna, the improvement comprising subdividing the input signal into a plurality of sub-bands, each sub-band containing a different spectral component of the input signal, up-converting and amplifying each sub-band, and then combining the amplified sub-bands for transmission via the antenna, wherein each sub-band's relative amplitude and phase values are calibrated so that the combined signals approximate the input signal to be transmitted, wherein the calibration step further comprises making an initial relative amplitude and phase measurement, and then making subsequent amplitude only measurements using a swept CW signal for each sub-band to determine amplitude and phase corrections for each sub-band.

2. In a method of transmitting a signal based on a received analog input signal wherein the input signal is amplified for transmission via an antenna, the improvement comprising subdividing the input signal into a plurality of sub-bands, each sub-band containing a different spectral component of the input signal, up-converting and amplifying each sub-band, and then combining the amplified sub-bands for transmission via the antenna, wherein each sub-band's relative amplitude and phase values are calibrated so that the combined signals approximate the input signal to be transmitted, wherein the calibration step further comprises generating a pair of CW signals and iteratively varying the relative amplitude and phases of the pair of CW signals until a summed output is minimized to determine the relative amplitude and phase values for the subdividing step.

3. In a method of transmitting a signal based on a received analog input signal wherein the input signal is amplified for transmission via an antenna, the improvement comprising subdividing the input signal into a plurality of sub-bands, each sub-band containing a different spectral component of the input signal, up-converting and amplifying each sub-band, and then combining the amplified sub-bands for transmission via the antenna, wherein each sub-band's relative amplitude and phase values are calibrated so that the combined signals approximate the input signal to be transmitted, wherein the calibration step further comprises generating a test signal, amplifying the test signal and looping back the amplified signal to a receiver and modulator for measuring of the amplitude and phase of the looped back signal relative to the amplitude and phase of a signal corresponding to the analog input.

4. The method of claim 3, wherein the test signal comprises a number of test signals, each test signal transmitted over the same frequency range using different spreading codes.

5. In a method of transmitting a signal based on a received analog input signal wherein the input signal is amplified for transmission via an antenna, the improvement comprising subdividing the input signal into a plurality of sub-bands, each sub-band containing a different spectral component of the input signal, up-converting and amplifying each sub-band, and then combining the amplified sub-bands for transmission via the antenna, wherein each sub-band's relative amplitude and phase values are calibrated so that the combined signals approximate the input signal to be transmitted, wherein the calibration step further comprises:
providing a test signal, amplifying the test signal and transmitting the amplified test signal using a first transceiver to a second transceiver,
determining the relative amplitude and phase values of the test signal by digitizing the test signal and transforming the digitized signal into sub-bands and amplifying the sub-bands, the second transceiver transmitting the determined relative amplitude and phase values to the first transceiver to set the amplitude and phase of the sub-bands for the subdividing step.

6. The method of claim 5, wherein the first receiver includes a loop back switch to allow transmission of the test signal to the second transceiver and receipt of the determined relative amplitude and phase, and the second transceiver includes a loop back switch to receive the transmitted test signal, and to permit transmission of the determined relative amplitude and phase of the sub-bands to the first transceiver.

7. In a transmitter system, wherein a received analog input signal is transmitted via an antenna using an up-converter and an amplifier, the improvement comprising:
a processing module that converts the received analog input signal into a digital signal, parses the digitized signal into a plurality of sub-bands, calibrates the sub-bands, and converts each sub-band into an analog signal;
an up-converter and amplifier for each sub-band, and
a combiner to combine each amplified sub-band for transmission via the antenna.

8. The system of claim 7, further comprising a means for calibrating out amplitude and phase differences in each digitized sub-band.

9. The system of claim 8, wherein the calibrating means further comprises means for generating a test signal corresponding to each sub-band and measuring the output signal for each sub-band to determine amplitude only corrections.

10. The system of claim 8, wherein the calibrating means further comprises means for generating a test signal corresponding to each sub-band and measuring the output signal for each sub-band to determine amplitude and phase corrections.

11. The system of claim 8, wherein the calibrating means further comprises means for generating a pair of test signals and varying the amplitude and phase of the test signals, and means for detecting the zero output signal of the combiner to determine the amplitude and phase values for the digitized sub-bands.

12. The system of claim 8, wherein the calibrating means further comprises means for generating a test signal for output by one of the amplifiers, and a loop back switch downstream of the one amplifier, a transceiver receiving output from the loop back switch; output of the transceiver being sent to the processing module, the processing module measuring the amplitude and phase of the output from the transceiver relative to the test signal input to determine amplitude and phase corrections.

13. The system of claim 12, further comprising first and second transmitter systems, wherein the output of the loop back switch of the first transmitter system is transmitted to the transceiver of the second transmitter system, the second transmitter system transforming the test signal into sub-bands and numerically determining the relative amplitude and phases of the sub-bands, and then transmitting the numerically determined relative amplitude and phases to the first transmitter system for setting of the amplitude and phase values.

14. A processing module for transmitting an analog input signal comprising:
- an analog to digital converter for digitizing the analog input signal;
- means for subdividing the digitized signal into a plurality of sub-bands and calibrating the sub-bands to account for amplitude and phase differences;
- a digital to analog converter for each sub-band, the output of each digital to analog converter adapted for later up-converting, amplification, and combining into one signal for transmission purposes;
- a detector adapted to receive a sample of the combined output signal of the amplified sub-bands, and to send the sample to the subdividing means as part of calibrating the sub-bands.

15. The module of claim 14, wherein the subdividing means further comprises a microprocessor adapted to receive the output from the detector for calibration purposes.

* * * * *